(12) United States Patent
Kato

(10) Patent No.: US 12,186,794 B2
(45) Date of Patent: Jan. 7, 2025

(54) BENDING DEVICE AND COMPONENT SUPPLY DEVICE

(71) Applicant: FUJI CORPORATION, Chiryu (JP)

(72) Inventor: Satoshi Kato, Toyoake (JP)

(73) Assignee: FUJI CORPORATION, Chiryu (JP)

( * ) Notice: Subject to any disclaimer, the term of this patent is extended or adjusted under 35 U.S.C. 154(b) by 532 days.

(21) Appl. No.: 17/436,364

(22) PCT Filed: Mar. 8, 2019

(86) PCT No.: PCT/JP2019/009419
§ 371 (c)(1),
(2) Date: Sep. 3, 2021

(87) PCT Pub. No.: WO2020/183535
PCT Pub. Date: Sep. 17, 2020

(65) Prior Publication Data
US 2022/0161310 A1    May 26, 2022

(51) Int. Cl.
| | | |
|---|---|---|
| *B23P 19/00* | (2006.01) | |
| *B21D 5/02* | (2006.01) | |
| *B21D 43/02* | (2006.01) | |
| *H05K 13/02* | (2006.01) | |
| *H05K 13/04* | (2006.01) | |

(52) U.S. Cl.
CPC .............. *B21D 43/02* (2013.01); *B21D 5/02* (2013.01); *H05K 13/023* (2013.01)

(58) Field of Classification Search
CPC ...... H05K 13/02; H05K 13/023; H05K 13/04; H05K 13/0426; B21D 5/02; B21D 43/02
See application file for complete search history.

(56) References Cited

U.S. PATENT DOCUMENTS

| | | | | |
|---|---|---|---|---|
| 4,817,266 | A * | 4/1989 | Holcomb | H05K 13/0092 140/105 |
| 5,222,528 | A * | 6/1993 | Downing | H05K 13/0092 72/21.3 |
| 5,467,803 | A * | 11/1995 | Yoshimura | H05K 13/0092 140/105 |

FOREIGN PATENT DOCUMENTS

| | | | |
|---|---|---|---|
| JP | 01278917 A | * | 11/1989 |
| JP | 2-62100 A | | 3/1990 |
| JP | 2001-119199 A | | 4/2001 |

OTHER PUBLICATIONS

International Search Report mailed on May 21, 2019 in PCT/JP2019/009419 filed on Mar. 8, 2019 (2 pages).

* cited by examiner

*Primary Examiner* — Paul D Kim
(74) *Attorney, Agent, or Firm* — Oblon, McClelland, Maier & Neustadt, L.L.P.

(57) ABSTRACT

A bending device to bend leads of a component one by one in the same direction at different timings. The bending device including a support block below the component that is movable in a vertical direction; a pair of support members fixed to the support block, the pair of support members contacting and supporting the leads of the component from below; a pair of clamp arms swingably held to the support block, the pair of clamp arms contacting and clamping the leads of the component from above; and a pair of bending rollers arranged above the leads of the component that bend the leads at the different timings.

5 Claims, 17 Drawing Sheets

BENDING DEVICE AND COMPONENT SUPPLY DEVICE

TECHNICAL FIELD

The present application relates to a bending device that bends a lead of a lead component and a bending method, and a component supply device that supplies a lead component having the bent lead.

BACKGROUND ART

The following Patent Literature describes a technique for bending leads of a lead component.
Patent Literature 1: JP-A-H2-62100

BRIEF SUMMARY

Technical Problem

There is an object of the present specification to appropriately bend leads of a lead component.

Solution to Problem

In order to solve the above problems, the present specification discloses a bending device configured to bend multiple leads of a lead component one by one in the same direction at different timings.

In order to solve the above problems, the present specification discloses a component supply device including the bending device and supplying a lead component having multiple leads bent by the bending device.

In order to solve the above problems, the present specification discloses a bending method including bending multiple leads of a lead component one by one in the same direction at different timings.

Advantageous Effects

With the present disclosure, multiple leads are bent one by one in the same direction at different timings. As a result, the leads of a lead component can be appropriately bent.

DESCRIPTION OF EMBODIMENTS

Hereinafter, as embodiments of the present disclosure, an example of the present disclosure will be described in detail with reference to the drawings.

Figure 1:
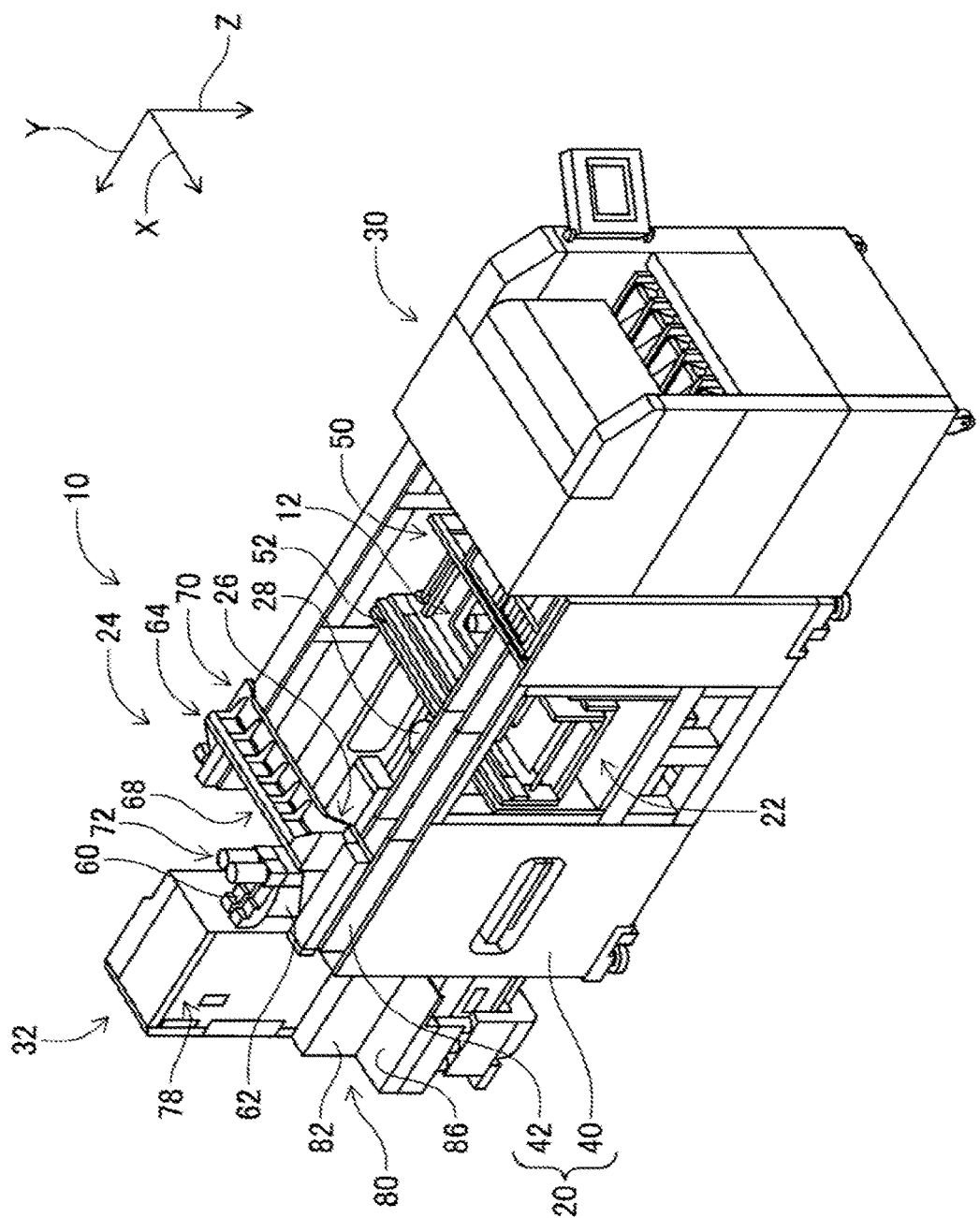
FIG. 1 is a perspective view illustrating a component mounter.

FIG. 1 illustrates component mounter 10. Component mounter 10 is a device for performing mounting work of a component on circuit substrate 12. Component mounter 10 includes device main body 20, substrate conveyance and holding device 22, component mounting device 24, imaging devices 26 and 28, bulk component supply device 30, and component supply device 32. Examples of circuit substrate 12 include a circuit board, and a substrate having a three-dimensional structure and the like, and examples of a circuit board include a printed wiring board and a printed circuit board and the like.

Device main body 20 includes frame 40 and beam 42 mounted on frame 40. Substrate conveyance and holding device 22 is arranged at the center of frame 40 in a front-rear direction, and includes conveyance device 50 and clamp device 52. Conveyance device 50 is a device that conveys circuit substrate 12, and clamp device 52 is a device that holds circuit substrate 12. Accordingly, substrate conveyance and holding device 22 conveys circuit substrate 12 and fixedly holds circuit substrate 12 at a predetermined position. In the following description, a conveyance direction of circuit substrate 12 is referred to as an X-direction, a horizontal direction perpendicular to an X-direction is referred to as a Y-direction, and a vertical direction to an X-direction is referred to as a Z-direction. In other words, a width direction of component mounter 10 is the X-direction, and the front-rear direction is the Y-direction.

Figure 2:
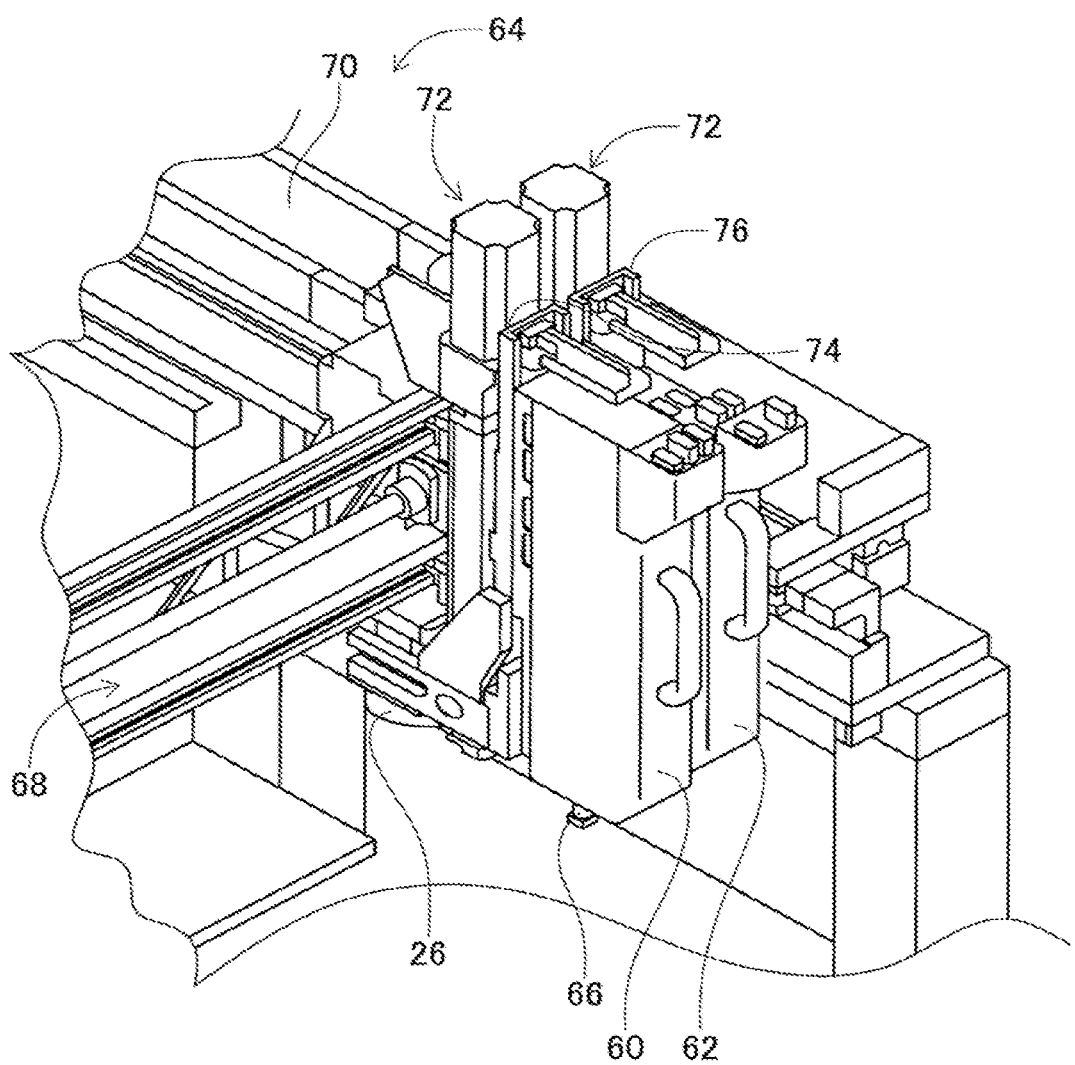
FIG. 2 is a perspective view illustrating a component mounter of a component mounting device.

Component mounting device 24 is arranged on beam 42, and includes two work heads 60 and 62, and work head moving device 64. As illustrated in FIG. 2, suction nozzle 66 is detachably provided on each lower end surface of work heads 60 and 62, and components are held by suction nozzle 66. In addition, work head moving device 64 has X-direction moving device 68, Y-direction moving device 70, and Z-direction moving device 72. Two work heads 60 and 62 are integrally moved to any positions on frame 40 by X-direction moving device 68 and Y-direction moving device 70. In addition, each of work heads 60 and 62 is detachably mounted to sliders 74 and 76, and Z-direction moving devices 72 individually move sliders 74 and 76 in an up-down direction. That is, work heads 60 and 62 are individually moved in the up-down direction by Z-direction moving device 72.

Imaging device 26 is attached to slider 74 in a state of facing downward and is moved in the X-direction, Y-direction, and Z-direction together with work head 60. As a result, imaging device 26 images any positions on frame 40. As illustrated in FIG. 1, imaging device 28 is arranged between substrate conveyance and holding device 22 and component supply device 32 on frame 40 in a state of facing upward. Thus, imaging device 28 images components held by suction nozzles 66 of work heads 60 and 62.

Bulk component supply device 30 is arranged at one end portion of frame 40 in the front-rear direction. Bulk component supply device 30 is a device that aligns multiple scattered components to supply the components in an aligned state. That is, bulk component supply device 30 is a device that aligns the multiple components in any orientation to a predetermined orientation to supply the components in the predetermined orientation.

Component supply device 32 is arranged at the other end portion of frame 40 in the front-rear direction. Component supply device 32 includes tray-type component supply device 78 and feeder-type component supply device 80. Tray-type component supply device 78 is a device that supplies components in a state of being placed on a tray. Feeder-type component supply device 80 is a device that supplies components by tape feeder 82. Tape feeder 82 will be described in detail below. Examples of the components supplied by bulk component supply device 30 and component supply device 32 include electronic circuit components, components of a solar cell, and components of a power module. Examples of the electronic circuit component include a component having leads, a component without leads, and the like.

Tape feeder 82 is detachably mounted on tape feeder holding stand 86 fixedly provided at an end portion on the other side of frame 40. Tape feeder 82 is a taped lead component supply device that detaches axial components from taped component 88 (refer to FIG. 3), and supplies the detached axial components to work heads 60 and 62 of component mounter 10 in a state where the lead wires of the detached axial components are bent.

Figure 3:
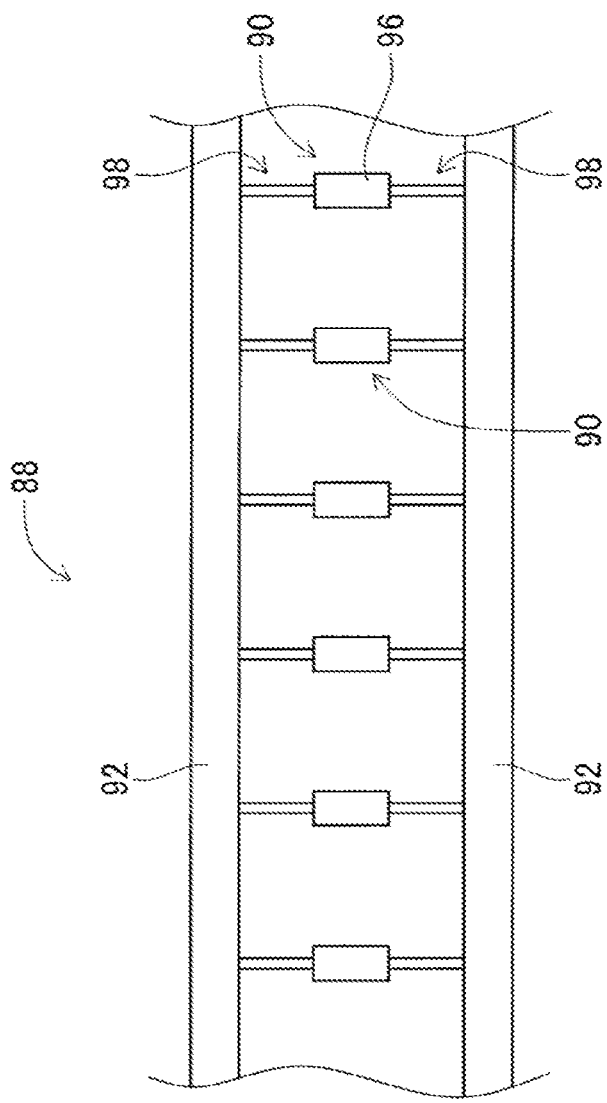
FIG. 3 is a plan view illustrating a taped component.

As illustrated in FIG. 3, taped component 88 includes multiple axial components 90 and two carrier tapes 92. Axial component 90 generally includes cylindrical component main body 96 and two lead wires 98. Two lead wires 98 are generally straight and are fixed to both end surfaces of component main body 96 coaxially with the axial center of component main body 96. Axial component 90 is taped to two carrier tapes 92 at distal ends of two lead wires 98, that is, at the end opposite to component main body 96 in a state where axial component 90 is sandwiched between two carrier tapes 92. Multiple axial components 90 are taped at equal pitches to two carrier tapes 92.

Figure 4:
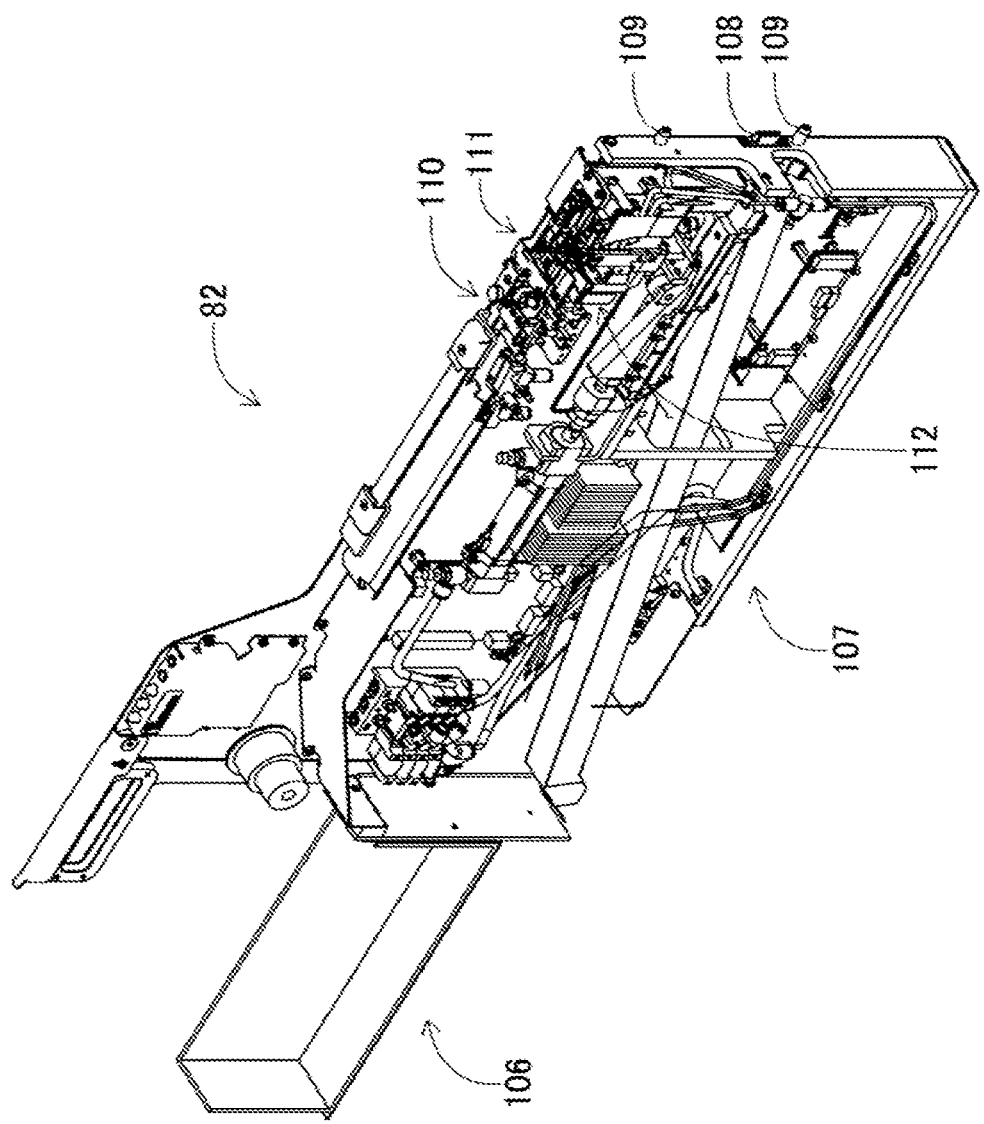
FIG. 4 is a perspective view of a tape feeder.

As illustrated in FIG. 4, tape feeder 82 includes housing box 106 and feeder main body 107. In the following description, a direction from housing box 106 to feeder main body 107 is described as a front direction, and a direction from feeder main body 107 to housing box 106 is described as a rear direction. Connector 108 and two pins 109 are provided on an end surface of the front side of feeder main body 107. When tape feeder 82 is mounted on tape feeder holding stand 86, electric power is supplied to connector 108 by being connected to a connector connection section (not illustrated) formed in tape feeder holding stand 86, and tape feeder 82 is accurately positioned by fitting pin 109 into a pin hole (not illustrated) formed in tape feeder holding stand 86. In addition, taped component 88 is housed in housing box 106 in a folded state. Then, taped component 88 housed in housing box 106 is pulled out, and taped component 88 is extended on an upper end surface of feeder main body 107.

Figure 5:
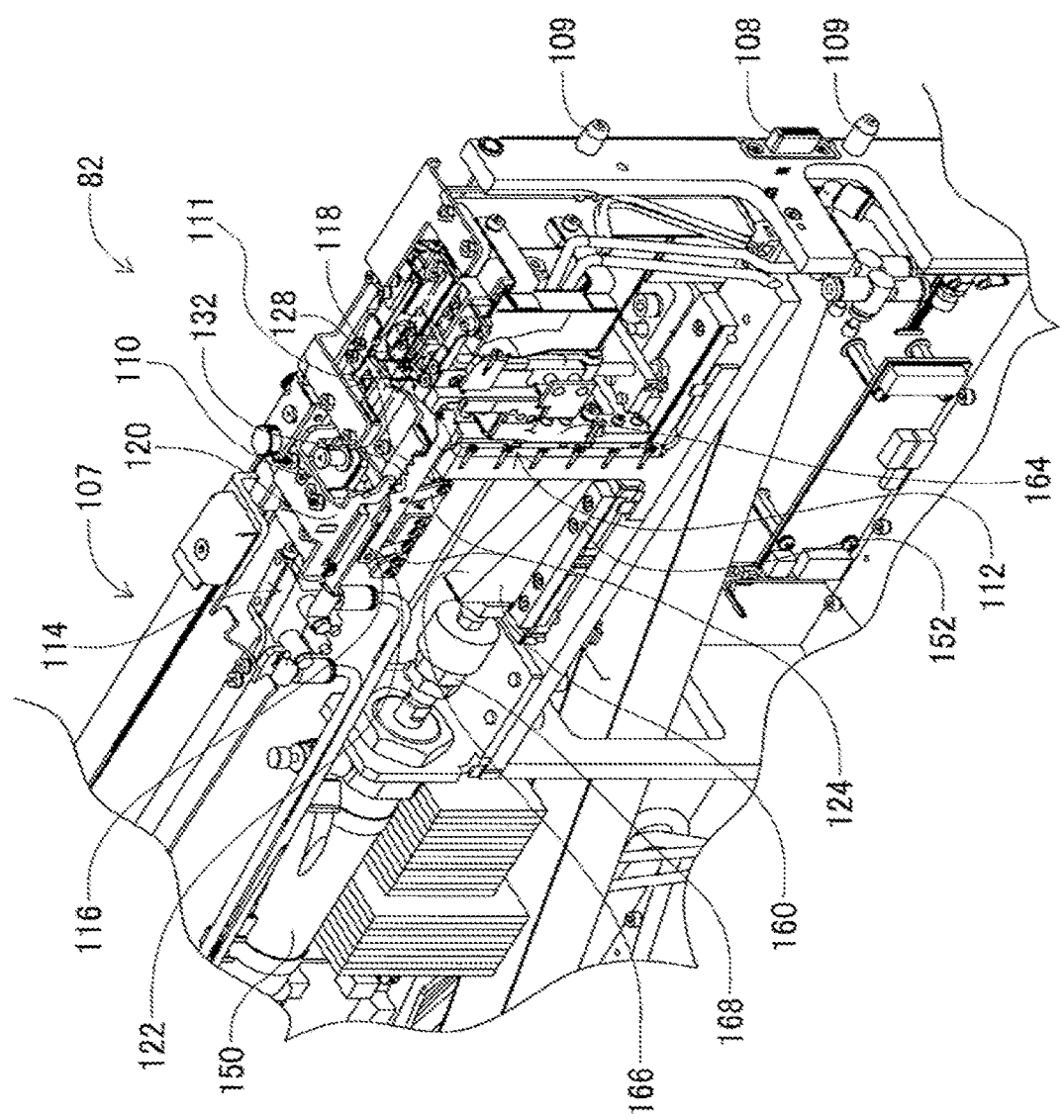
FIG. 5 is an enlarged perspective view of a tape feeder.
Figure 6:
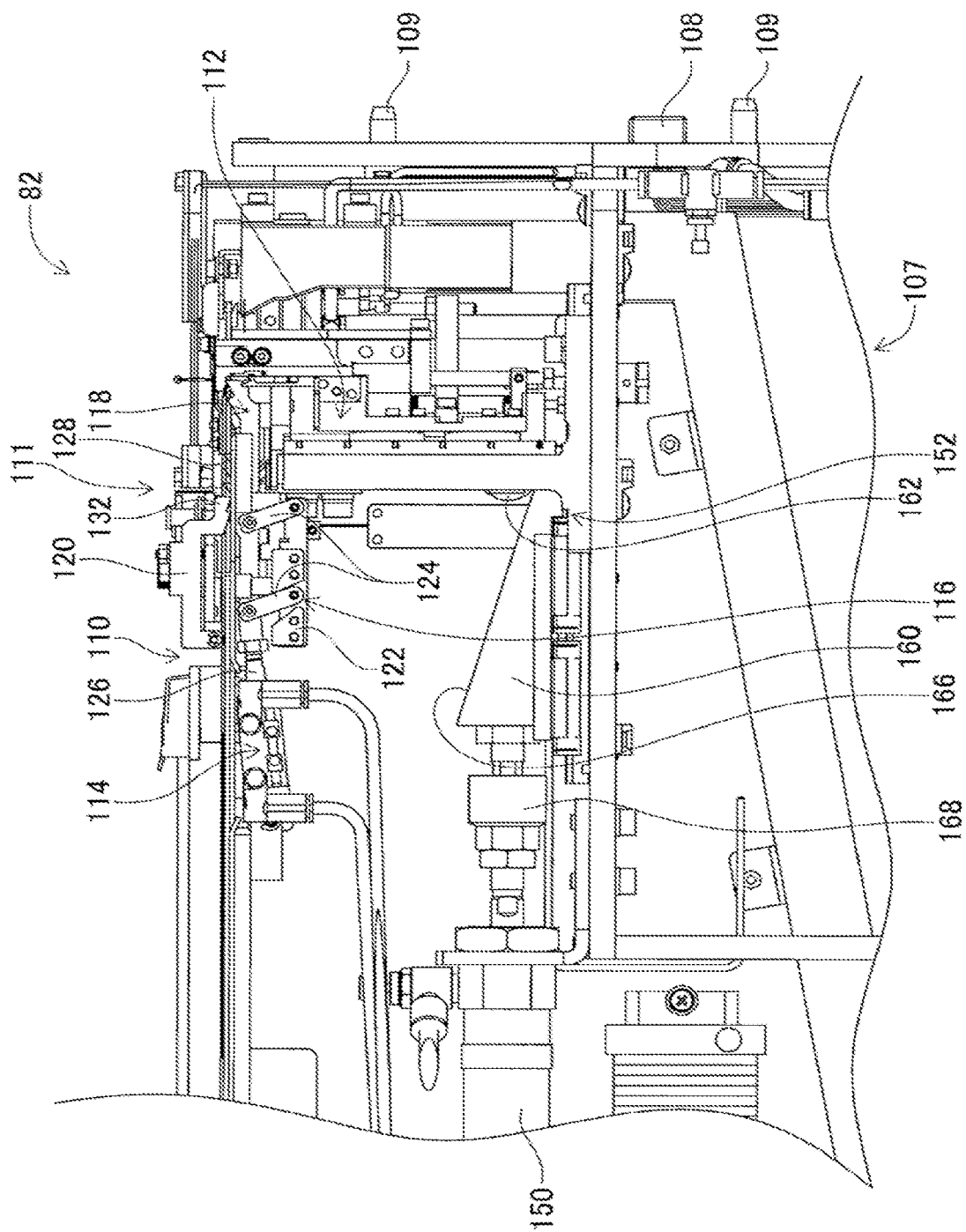
FIG. 6 is an enlarged side view of a tape feeder.

As illustrated in FIGS. 5 and 6, feeding device 110, cutting device 111, and bending device 112 are arranged inside feeder main body 107. Feeding device 110 includes piston 114, link mechanism 116, feeding arm 118, and return prevention arm 120. Piston 114 is arranged so as to extend in a generally horizontal direction at an upper end portion in feeder main body 107. Link mechanism 116 includes support block 122 and two support arms 124, and is arranged on a front side of piston 114. Support block 122 is fixed to framework of feeder main body 107. Two support arms 124 are arranged side by side in the front-rear direction in an orientation extending in the up-down direction, and are swingably attached to support block 122 at a lower end. Feeding arm 118 is swingably attached to upper ends of two support arms 124 in an orientation extending in a generally horizontal direction. Piston rod 126 of piston 114 is connected to a rear end of feeding arm 118. As a result, feeding arm 118 moves in the front-rear direction by the operation of piston 114.

Multiple feed teeth 128 are formed at a center portion of an upper edge of feeding arm 118. Multiple feed teeth 128 engage with lead wires 98 of axial components 90 of taped component 88 extending on an upper end surface of feeder main body 107. The formed pitch of multiple feed teeth 128 is the same as the arrangement pitch of axial components 90 in taped component 88. As a result, taped component 88 is fed toward a component supply position on the front side of tape feeder 82 when feeding arm 118 is moved forward by the operation of piston 114.

Return prevention arm 120 is arranged above taped component 88 extending on an upper end surface of feeder main body 107, and teeth 132 are formed on a distal end of return prevention arm 120. Teeth 132 engage lead wires 98 of axial components 90 of taped component 88 from a rear side, and the movement of taped component 88 to the rear side, that is, the reversion of taped component 88 is prevented.

Figure 7:
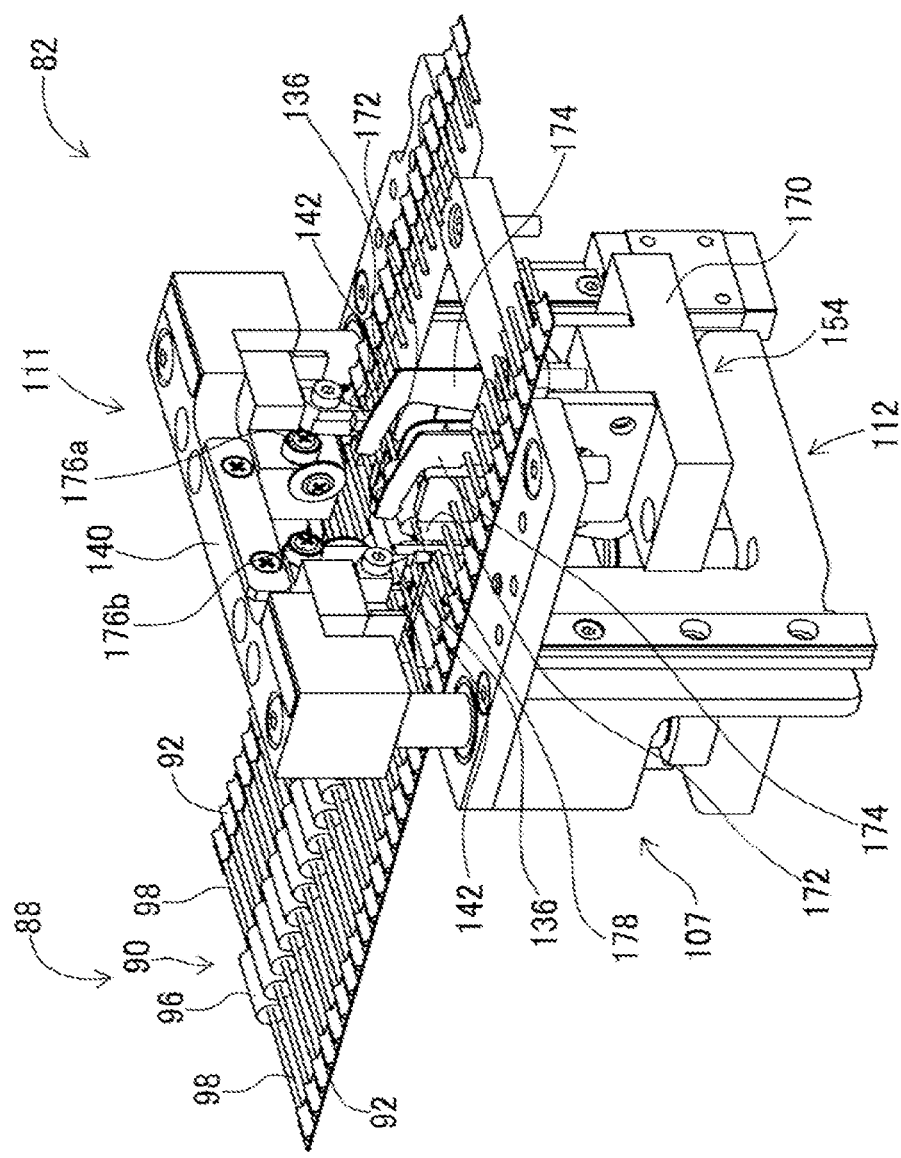
FIG. 7 is an enlarged perspective view of a cutting device and a bending device.

As illustrated in FIG. 7, a pair of stoppers 136 is erected on a front side of tape feeder 82 to which taped component 88 is fed by feeding arm 118 so as to extend upward from between two carrier tapes 92 of taped component 88 extending on an upper surface of feeder main body 107. The pair of stoppers 136 is erected at positions facing a pair of lead wires 98 of taped component 88 extending on the upper surface of feeder main body 107. As a result, a pair of lead wires 98 of axial component 90 taped by taped component 88 fed by feeding arm 118 abuts the pair of stoppers 136, and axial component 90 is positioned.

Cutting device 111 includes lifting and lowering block 140 and a pair of cutters 142. Lifting and lowering block 140 is supported by feeder main body 107 so as to be lifted and lowered above taped component 88 extending on the upper surface of feeder main body 107. Lifting and lowering block 140 is positioned above axial component 90 positioned by stoppers 136 of taped component 88 extending on the upper surface of feeder main body 107. In addition, lifting and lowering block 140 is controllably lifted and lowered by the operation of a piston (not illustrated).

The pair of cutters 142 of cutting device 111 is fixed to a lower surface of lifting and lowering block 140 in a state in which cutting edges are directed downward. One cutting edge of the pair of cutters 142 faces one of the pair of lead wires 98 of axial component 90 positioned by stoppers 136 in a state in which lifting and lowering block 140 is lifted. In addition, the other cutting edge of the pair of cutters 142 faces the other of the pair of lead wires 98 of axial component 90 positioned by stoppers 136 in a state in which lifting and lowering block 140 is lifted.

Figure 8:
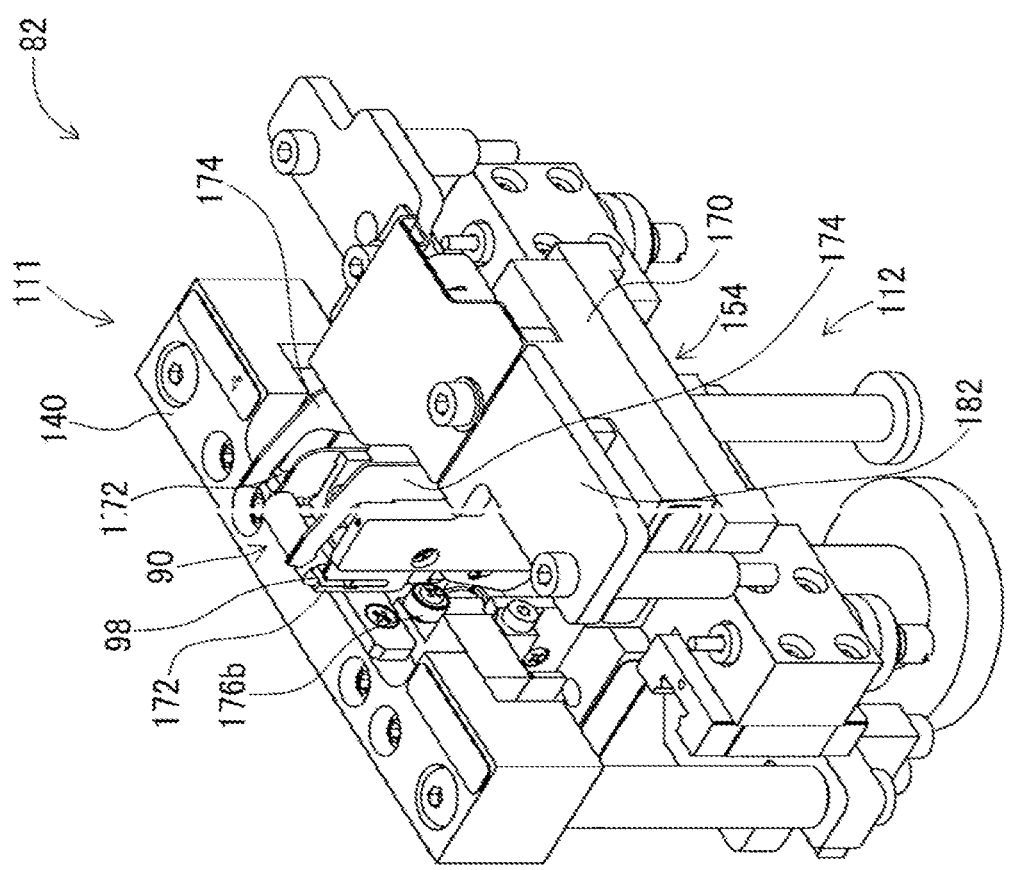
FIG. 8 is an enlarged perspective view of a cutting device and a bending device.

As illustrated in FIGS. 5 and 6, bending device 112 includes piston 150, cam mechanism 152, and forming mechanism 154 (refer to FIGS. 7 and 8). Piston 150 is arranged so as to extend in a generally horizontal direction at a center portion in feeder main body 107. Cam mechanism 152 includes cam member 160, roller 162, and connection block 164, and is arranged on a front side of piston 150. Cam member 160 has inclined surface 166 extending downward toward the front, and is movable in the front-rear direction.

Piston rod 168 of piston 150 is connected to a rear end of cam member 160. Roller 162 is arranged in contact with inclined surface 166 of cam member 160 and serves as a cam follower. Roller 162 is pivotably held by a lower end portion of connection block 164, and connection block 164 is movable in the up-down direction. As a result, when cam member 160 moves in the front-rear direction by the operation of piston 150, roller 162 moves along inclined surface 166 of cam member 160, and connection block 164 is lifted and lowered.

Figure 9:
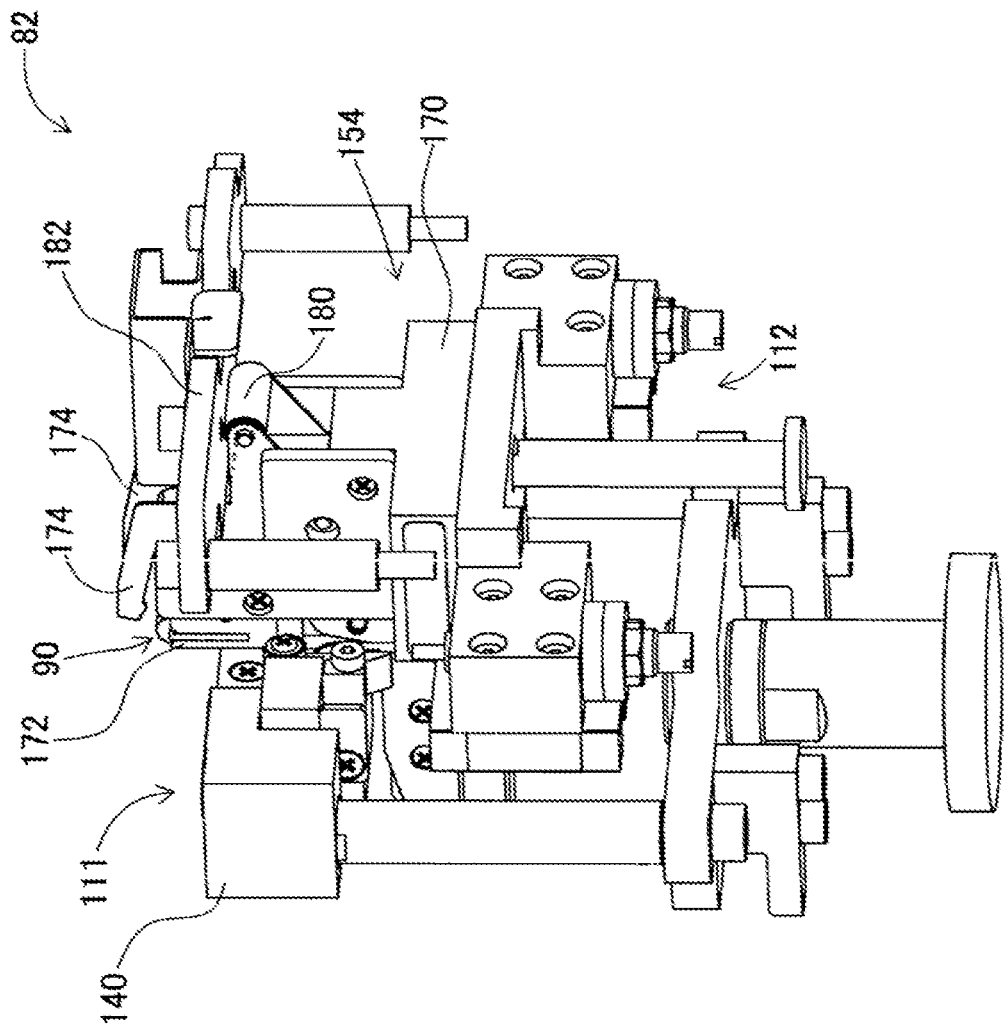
FIG. 9 is an enlarged perspective view of a cutting device and a bending device.
Figure 10:
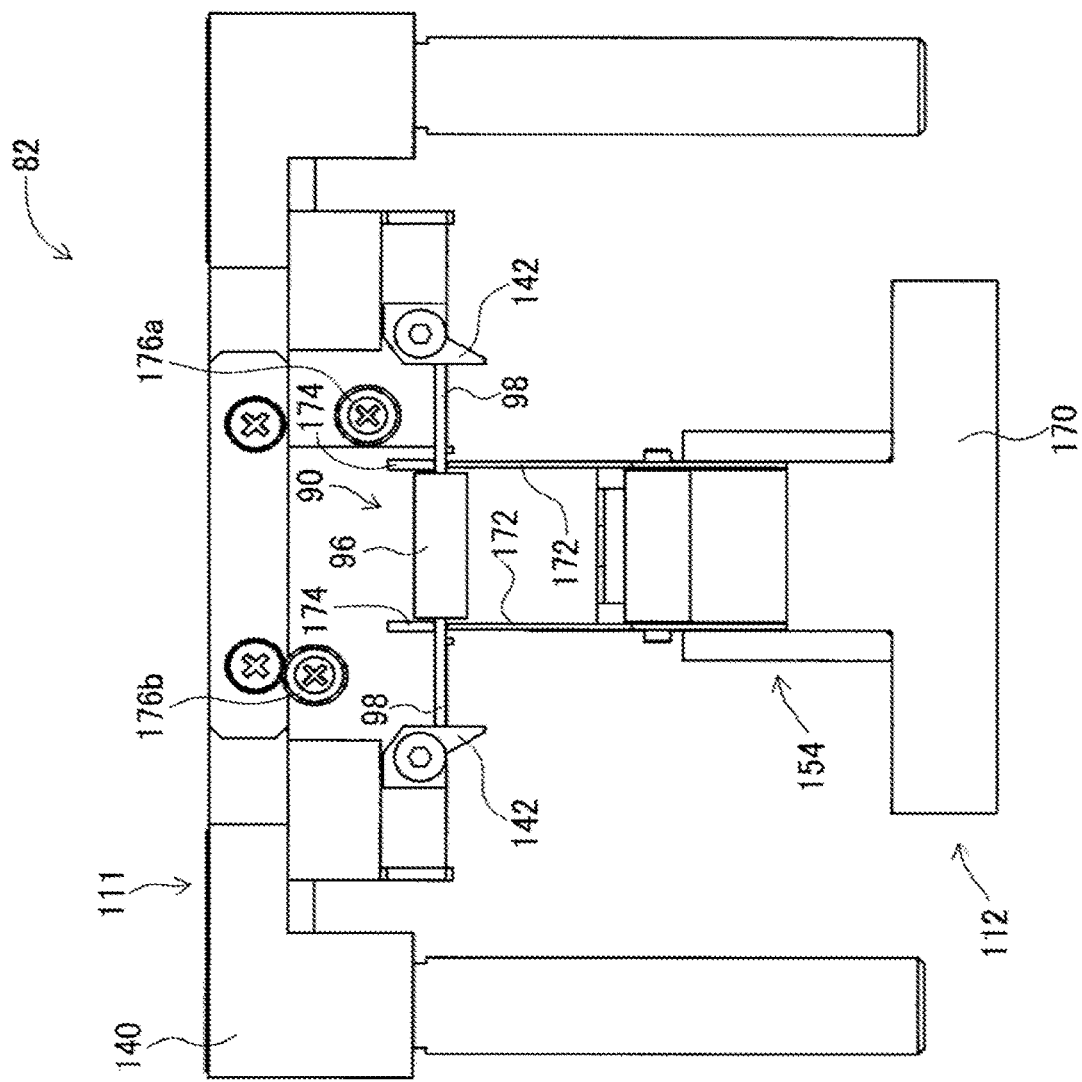
FIG. 10 is an operation view of a bending device.

As illustrated in FIGS. 7 to 10, forming mechanism 154 includes support block 170, a pair of support members 172, a pair of clamp arms 174, and a pair of bending rollers 176. FIGS. 7 to 9 are perspective views of forming mechanism 154, and FIG. 10 is a front view of forming mechanism 154.

Support block 170 is arranged below axial component 90 positioned by stoppers 136, and is connected to connection block 164 of cam mechanism 152. In FIGS. 7 to 10, connection block 164 is omitted. Support member 172 is generally plate-shaped, and V-shaped groove 178 is formed at an upper end edge thereof. The pair of support members 172 is arranged so as to face each other, and is fixed to support block 170. The pair of support members 172 are fixed to support block 170 such that grooves 178 of each other are positioned below the pair of lead wires 98 of axial component 90 positioned by stoppers 136. Incidentally, a distance between lead wires 98 of positioned axial component 90 and the upper edges of support members 172 are extremely short. That is, support members 172 are positioned below lead wires 98 at a slight distance from lead wires 98 of positioned axial component 90.

The pair of clamp arms 174 is generally L-shaped, and is swingably held in the front-rear direction by support block 170 at a lower end portion thereof. The pair of clamp arms 174 extends upward of taped component 88 extending from support block 170 to the upper surface of feeder main body 107 on a front side of the pair of support members 172. Then, a portion of the pair of clamp arms 174 extending above taped component 88 is bent rearward, that is, upward of the pair of support members 172 generally at 90 degrees. As a result, the distal end portions of the pair of clamp arms 174 are positioned above the pair of support members 172 so as to sandwich the pair of lead wires 98 of taped component 88 extending on the upper surface of feeder main body 107. The pair of clamp arms 174 is swingable rearward by the operation of a piston (not illustrated).

As illustrated in FIG. 9, the pair of clamp arms 174 is connected by connection roller 180 at a front end portion. A fixed table 182 is fixed to the upper surface of feeder main body 107 above connection roller 180. Fixed table 182 is not illustrated in FIG. 7 in order to secure the visibility of clamp arms 174 and the like, and feeder main body 107 is not illustrated in FIGS. 8 and 9 in order to secure the visibility of support block 170 and the like. Incidentally, fixed table 182 is arranged ahead of lifting and lowering block 140, and, when viewed from the above, the pair of clamp arms 174 is positioned between lifting and lowering block 140 and fixed table 182, and only connection roller 180 that connects the pair of clamp arms 174 is positioned below fixed table 182.

The pair of bending rollers 176 is arranged on a side surface of lifting and lowering block 140 arranged above taped component 88 extending on the upper surface of feeder main body 107. The pair of bending rollers 176 is capable of rotating around an axis extending in the front-rear direction on the side surface of lifting and lowering block 140, and is positioned above the pair of lead wires 98 of axial component 90 positioned by stoppers 136. The pair of bending rollers 176 is arranged at positions deviated in the up-down direction, that is, at different heights in the up-down direction. In a case where the pair of bending rollers 176 is distinguished from each other, bending roller 176 positioned below is referred to as first bending roller 176a, and bending roller 176 positioned above is referred to as second bending roller 176b.

In component mounter 10, the component mounting work is performed on circuit substrate 12 held by substrate conveyance and holding device 22 with the above-described configuration. Specifically, circuit substrate 12 is conveyed to a work position and held at that position in a fixed manner by clamp device 52. Next, imaging device 26 moves above circuit substrate 12 and images circuit substrate 12. As a result, information on the positions of a pair of through holes (not illustrated) formed in circuit substrate 12 is obtained. In addition, bulk component supply device 30 or component supply device 32 supplies components at predetermined supply positions. The supply of components by feeder-type component supply device 80 of component supply device 32 will be described in detail below.

In feeder-type component supply device 80, tape feeder 82 feeds taped component 88 extending on an upper end surface of feeder main body 107 toward the component supply position by the operation of piston 114 of feeding device 110. When taped component 88 is fed and axial component 90 of taped component 88 reaches the component supply position, lead wires 98 of axial component 90 abut stoppers 136 and are positioned. That is, the position where axial component 90 is positioned by stoppers 136 is the component supply position.

Then, when axial component 90 taped by taped component 88 is positioned by stoppers 136, the pair of clamp arms 174 swings rearward, that is, toward positioned axial component 90 by the operation of the piston. As a result, the pair of lead wires 98 of positioned axial component 90 is pressed from above to below by the pair of clamp arms 174. Next, support block 170 is lifted by the operation of piston 150. At this time, the pair of support members 172 fixed to support block 170 is also lifted, and the pair of lead wires 98 of positioned axial component 90 is supported from below in grooves 178 of the pair of support members 172. As a result, lead wires 98 of positioned axial component 90 are clamped in grooves 178 by support members 172 and clamp arms 174.

Subsequently, when lead wires 98 of positioned axial component 90 are clamped by support members 172 and clamp arms 174, lifting and lowering block 140 is lowered by the operation of the piston of cutting device 111. At this time, the pair of cutters 142 is lowered together with lifting and lowering block 140, and the pair of lead wires 98 of axial component 90 positioned by stoppers 136 is cut by the pair of cutters 142, as illustrated in FIG. 10. As a result, axial component 90 is separated from carrier tapes 92. Since lead wires 98 are clamped by support members 172 and clamp arms 174, lead wires 98 are appropriately cut by cutters 142.

Figure 11:
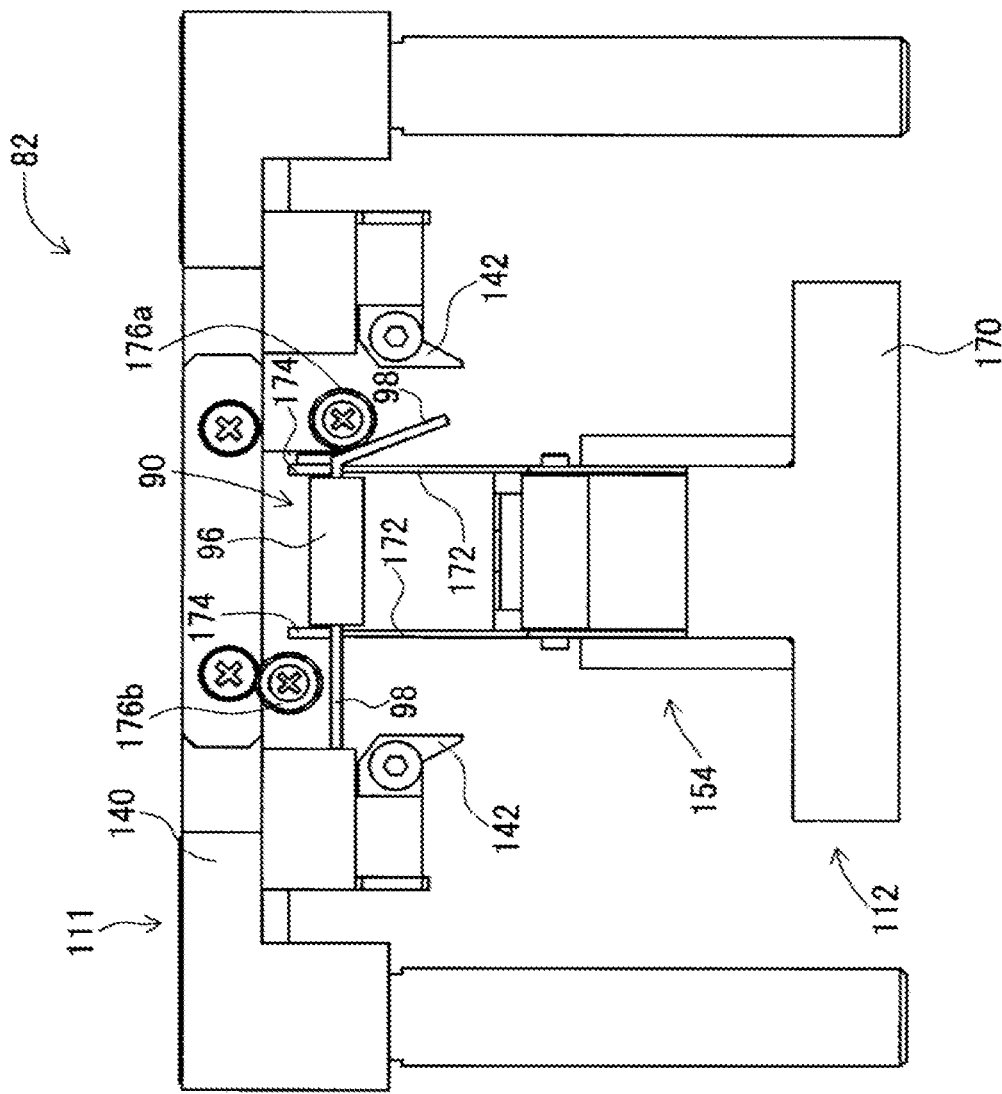
FIG. 11 is an operation view of a bending device.

In this manner, when lead wires 98 are cut and axial component 90 is separated from carrier tapes 92, support block 170 is further lifted, such that axial component 90 in a state in which lead wires 98 are clamped by support members 172 and clamp arms 174 also is lifted. At this time, one lead wire 98 of the pair of lead wires 98 of axial component 90 abuts a roller positioned below the pair of bending rollers 176, that is, first bending roller 176a. As support block 170 is lifted, lead wire 98 abutting first bending roller 176a is bent downward by first bending roller 176a, that is, in a direction orthogonal to the axial center of component main body 96, as illustrated in FIG. 11.

Figure 12:
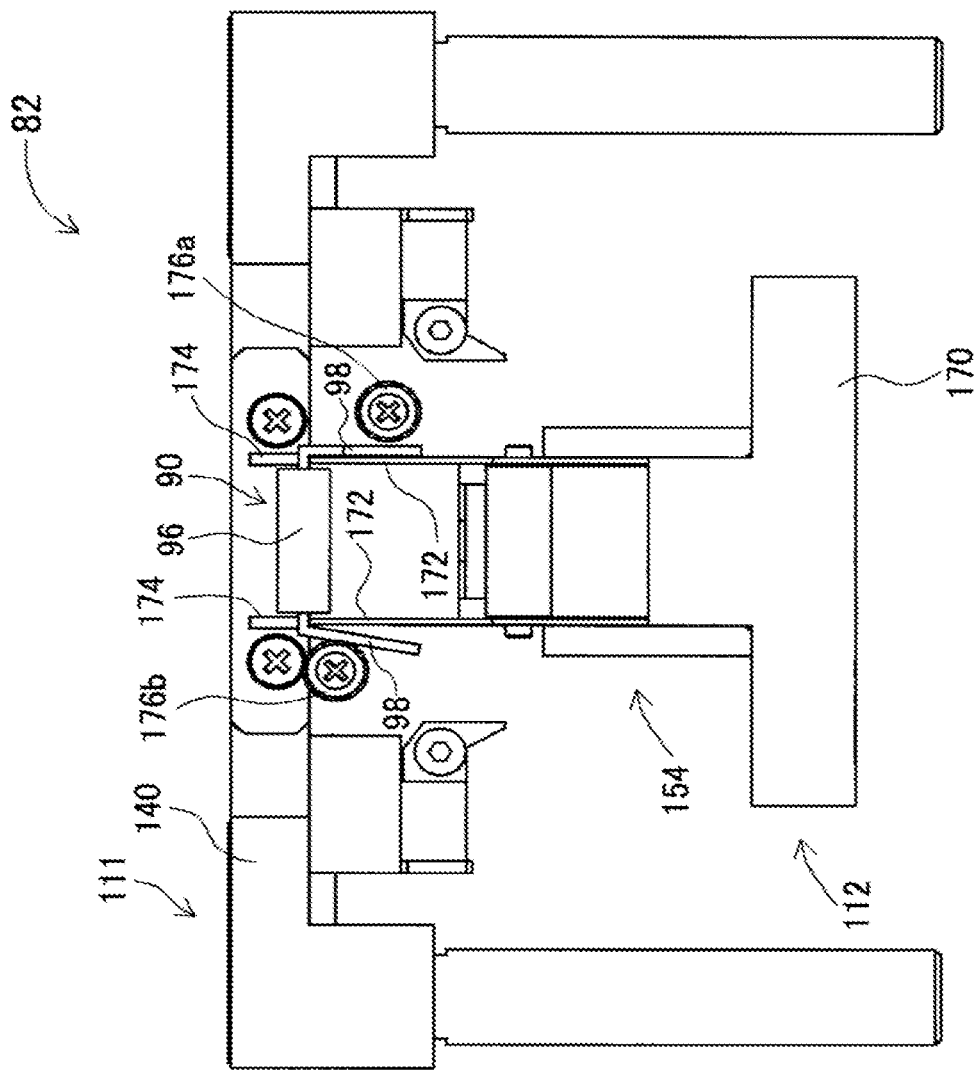
FIG. 12 is an operation view of a bending device.

When support block 170 is further lifted, the unbent lead wire of the pair of lead wires 98 of axial component 90 lifted together with support block 170, that is, lead wire 98 extending to the side opposite to lead wire 98 bent by first bending roller 176a abuts on the roller positioned above the pair of bending rollers 176, that is, second bending roller 176b. As support block 170 is lifted, lead wire 98 abutting second bending roller 176b is also bent downward in the same direction by second bending roller 176b, as illustrated in FIG. 12.

In this manner, in bending device 112 of tape feeder 82, the pair of bending rollers 176 is arranged at positions deviated in the up-down direction, and axial component 90 is lifted such that the pair of lead wires 98 abuts on the pair of bending rollers 176. As a result, when axial component 90 is lifted, the pair of lead wires 98 is bent in the same direction, that is, downward at different timings one by one. Since lead wires 98 are clamped by support members 172 and clamp arms 174, lead wires 98 are appropriately bent by bending rollers 176.

Figure 13:
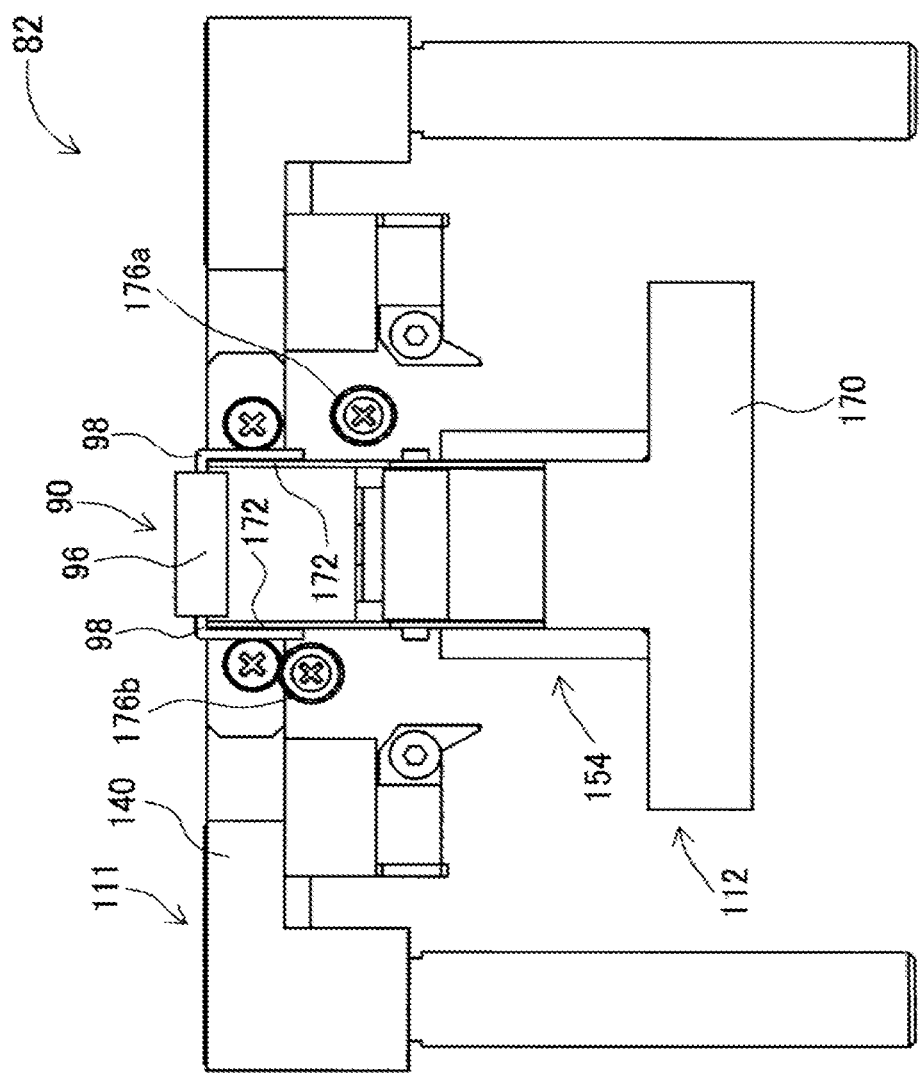
FIG. 13 is an operation view of a bending device.

In addition, even after the pair of lead wires 98 is bent in the direction orthogonal to the longitudinal direction of component main body 96 by the pair of bending rollers 176, axial component 90 is lifted together with support block 170 while lead wires 98 on the component main body side that are not bent are kept clamped by support members 172 and clamp arms 174. At this time, connection roller 180 arranged at the front end portion of clamp arms 174 abuts fixed table 182 and swings toward the front side, that is, the direction away from clamped lead wires 98, as illustrated in FIG. 8. As a result, the clamping of lead wires 98 by support members 172 and clamp arms 174 is released. That is, as illustrated in FIG. 13, in the pair of lead wires 98, axial component 90 is supported only by the pair of support members 172 from below. Then, axial component 90 is supplied in this state. That is, in tape feeder 82, after lead wires 98 clamped by support members 172 and clamp arms 174 are cut and bent, the clamping of lead wires 98 by clamp arms 174 is released, and axial component 90 in which the pair of lead wires 98 is bent in the direction orthogonal to the longitudinal direction of component main body 96 is supplied in a state where lead wires 98 are supported by support members 172.

Then, when axial component 90 is supplied by tape feeder 82, either of work heads 60 and 62 moves above axial component 90 and holds axial component 90 by suction nozzle 66. Subsequently, work heads 60 and 62 holding axial components 90 move above imaging device 28, such that imaging device 28 images an image of axial component 90 held by suction nozzle 66. In this manner, information on the error in the holding position of a component is obtained. Subsequently, work heads 60 and 62 holding axial components 90 move above circuit substrate 12, and a holding orientation of the held component is adjusted based on the positions of the through holes formed in circuit substrate 12, the holding positions of the components, and the like. At this time, the movement and the holding orientation of work heads 60 and 62 are adjusted such that the pair of through holes formed in circuit substrate 12 and the distal ends of the pair of lead wires 98 of axial component 90 held by suction nozzle 66 coincide with each other in the up-down direction. Then, work heads 60 and 62 are lowered, and axial component 90 is separated from suction nozzle 66. As a result, the pair of lead wires 98 is inserted through the pair of through holes, and axial component 90 is mounted on circuit substrate 12. In this manner, in order to insert the pair of lead wires 98 through the pair of through holes, the pair of lead wires 98 are bent in the same direction in tape feeder 82.

In tape feeder 82, as described above, the pair of lead wires 98 of one axial component 90 separated from taped component 88 is bent one by one in the same direction at different timings in a state clamped by support members 172 and clamp arms 174. As a result, a load on axial component 90 generated when lead wires 98 are bent is reduced, which makes it possible to suppress the damage or the like of axial component 90.

Figure 14:
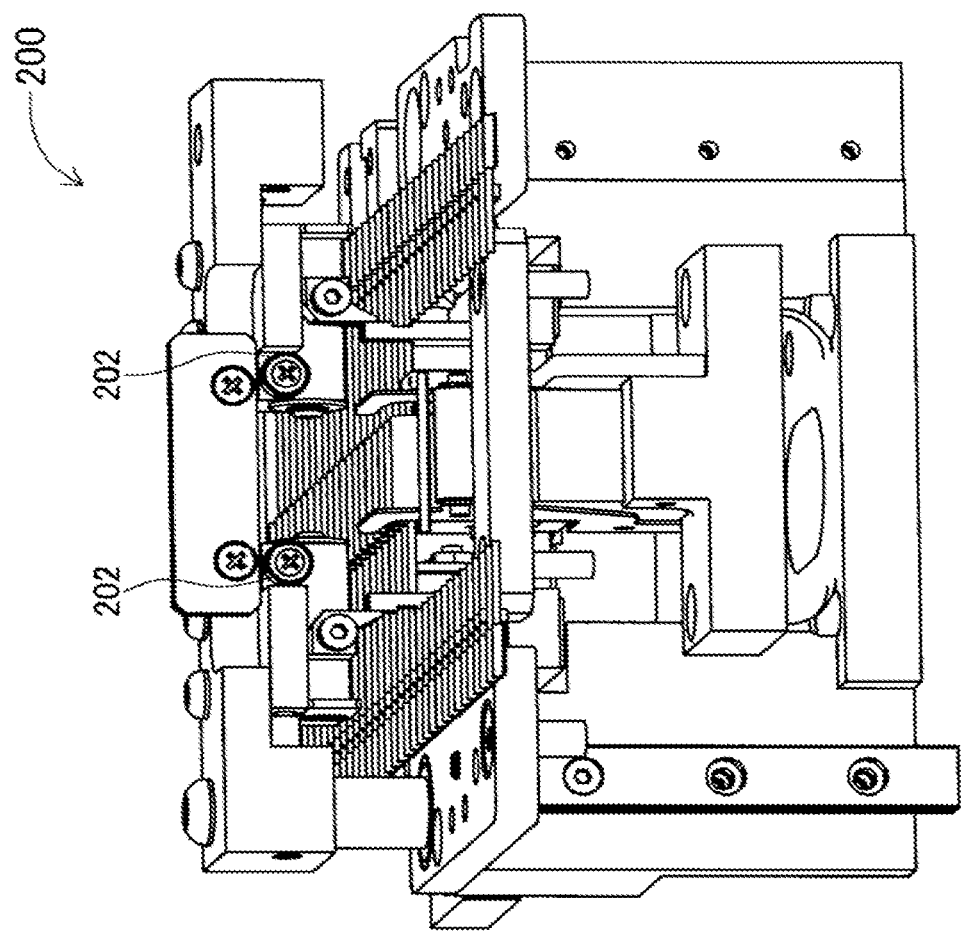
FIG. 14 is a perspective view illustrating a conventional tape feeder.
Figure 15:
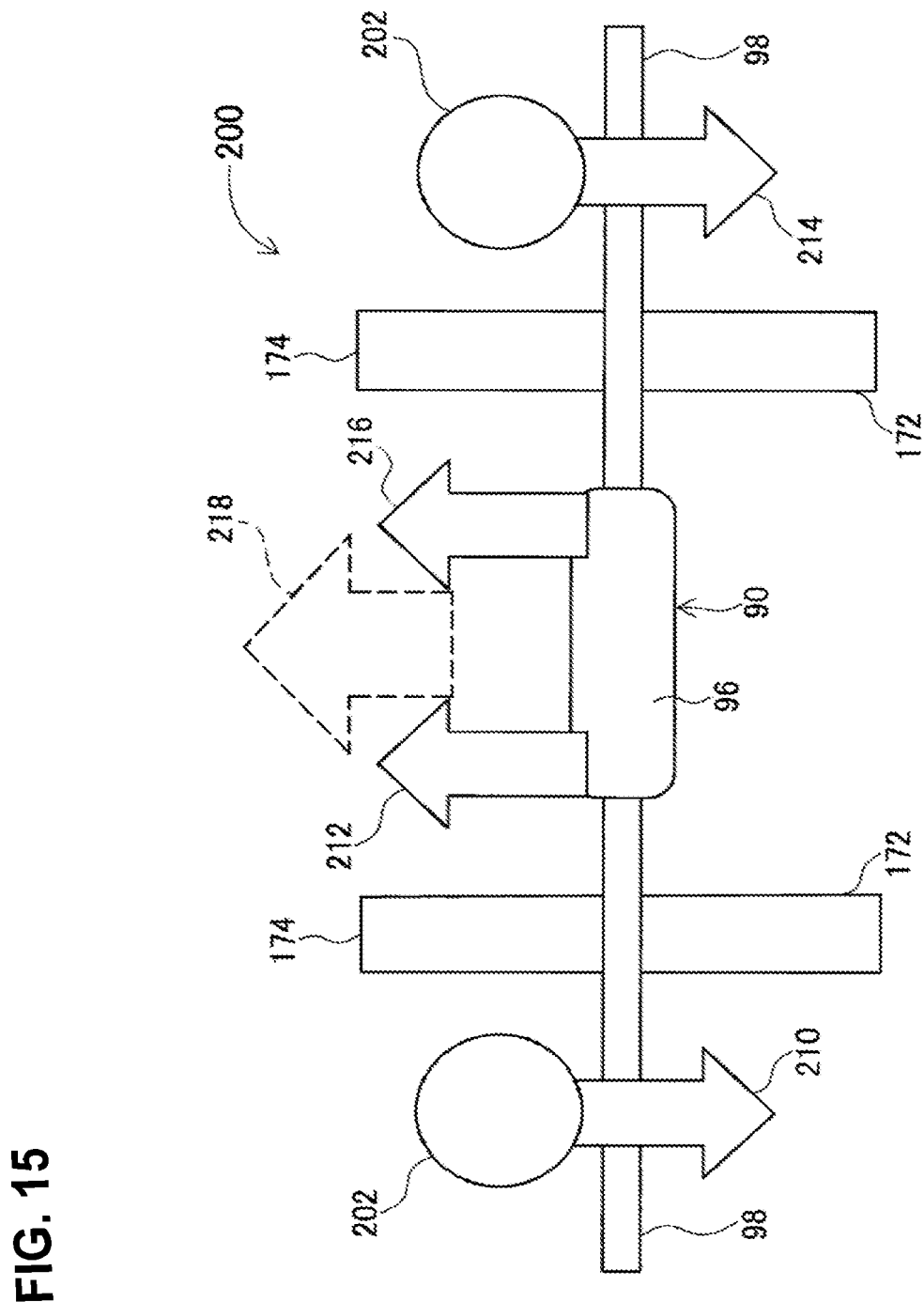
FIG. 15 is a conceptual view when lead wires are bent in a conventional tape feeder.

Specifically, in conventional tape feeder 200, as illustrated in FIG. 14, a pair of bending rollers 202 for bending the pair of lead wires 98 of axial component 90 is arranged at the same height without being deviated in the up-down direction. Therefore, when lead wires 98 clamped by support members 172 and the clamp arms 174 are bent, a large load is generated in component main body 96 of axial component 90. Specifically, when the pair of bending rollers 202 are arranged at the same height, as illustrated in FIG. 15, the pair of lead wires 98 clamped by support members 172 and clamp arms 174 abuts the pair of bending rollers 202 at the same timing, and is bent by the pair of bending rollers 202 at the same timing. That is, the pair of bending rollers 202 bends two pairs of lead wires 98 together at the same timing. At this time, reaction force 212 of force 210 in which one of the pair of lead wires 98 is pressed by one of the pair of bending rollers 202 and reaction force 216 of force 214 in which the other of the pair of lead wires 98 is pressed by the other of the pair of bending rollers 202 are simultaneously applied to component main body 96. That is, reaction force 218 obtained by combining reaction force 212 of force 210 in which one of the pair of lead wires 98 is pressed by one of the pair of bending rollers 202 and reaction force 216 of force 214 in which the other of the pair of lead wires 98 is pressed by the other of the pair of bending rollers 202 is applied to component main body 96. In this manner, when large reaction force 218 is applied to component main body 96, component main body 96, that is, axial component 90 may be damaged.

Figure 16:
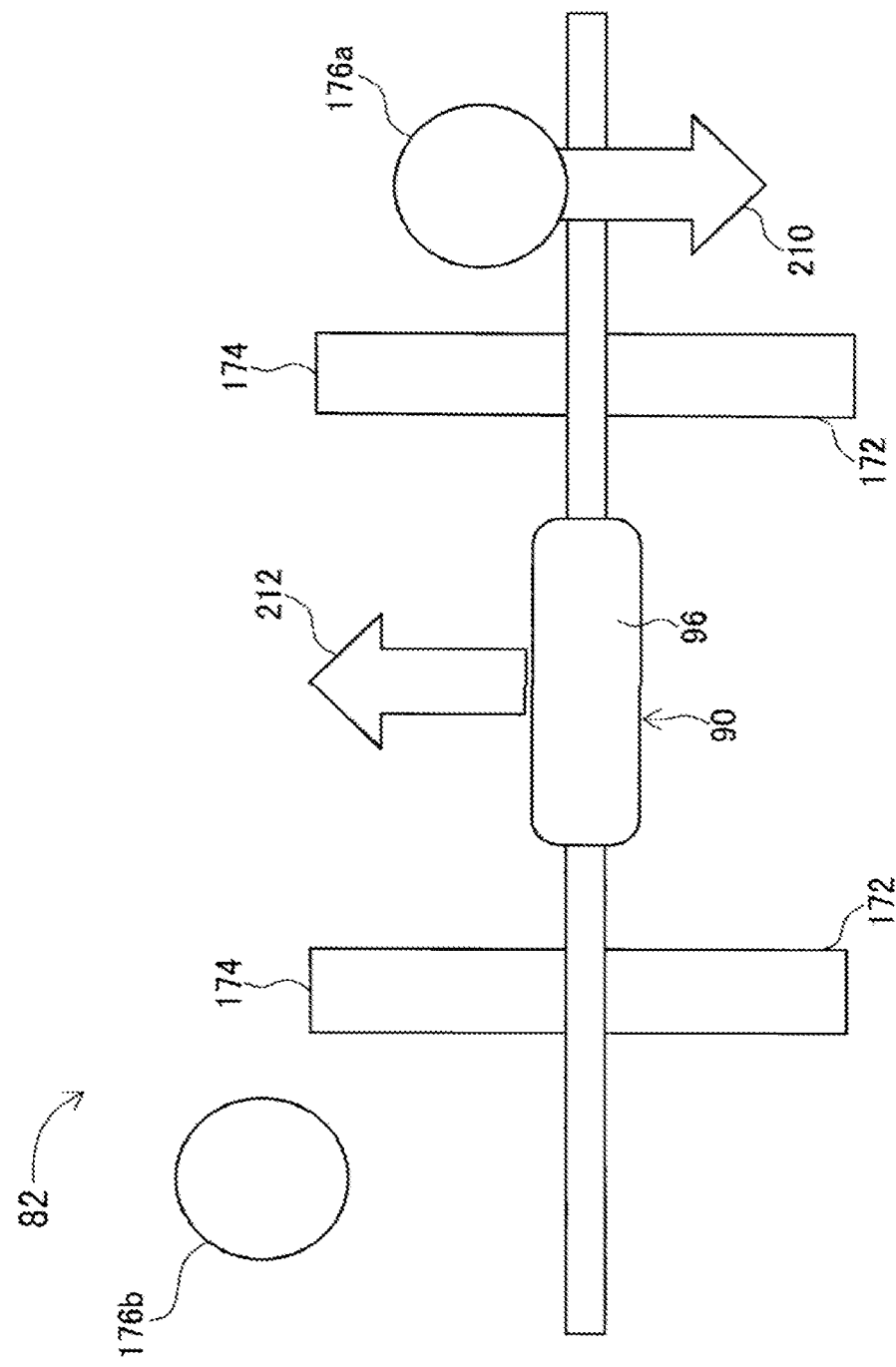
FIG. 16 is a conceptual view when lead wires are bent in a tape feeder of the present disclosure.
Figure 17:
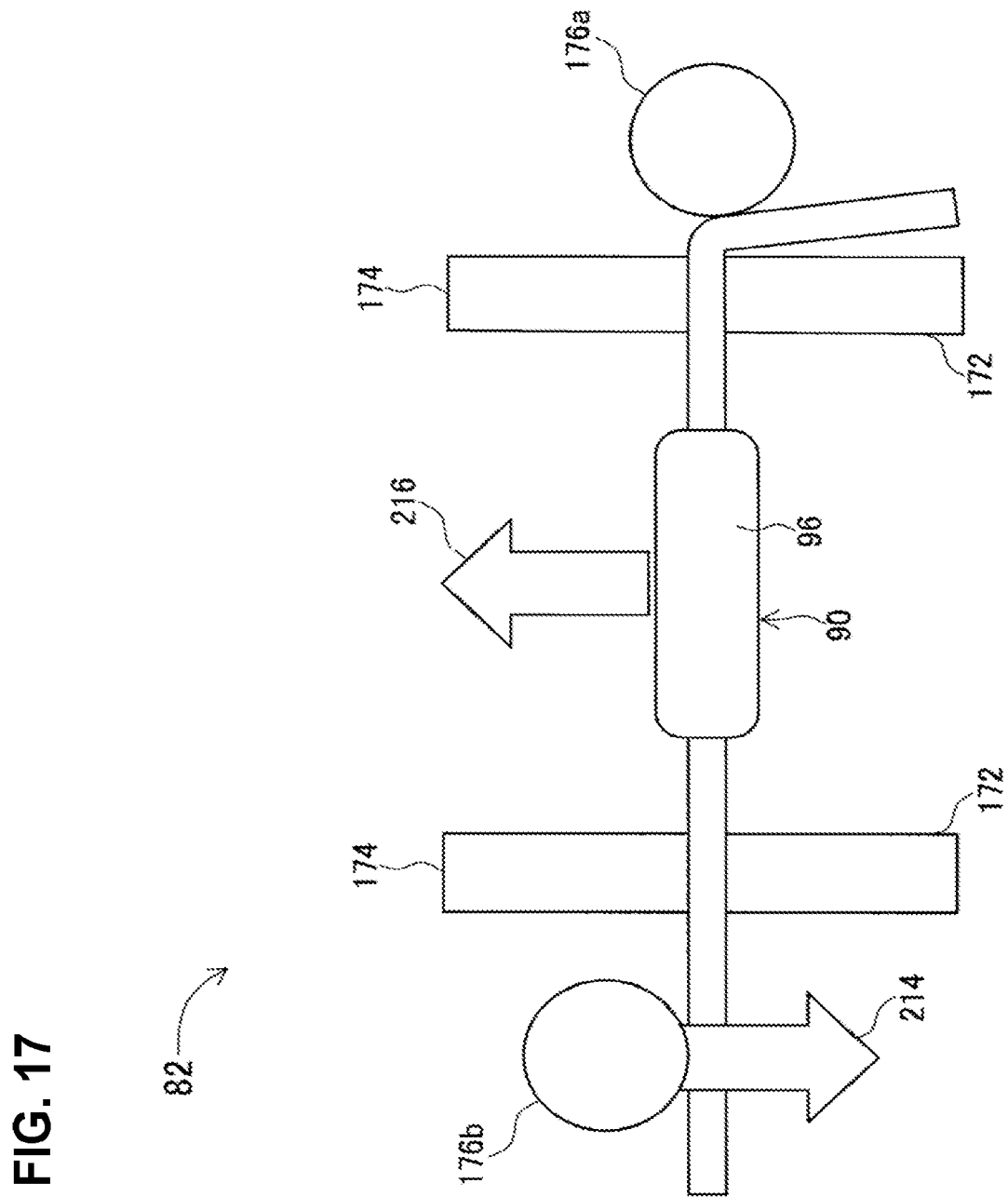
FIG. 17 is a conceptual view when lead wires are bent in a tape feeder of the present disclosure.

On the other hand, in tape feeder 82, since the pair of bending rollers 176 is arranged at different heights as described above, the pair of lead wires 98 of axial component 90 is bent one by one in the same direction at different timings. That is, as illustrated in FIG. 16, one of the pair of lead wires 98 clamped by support members 172 and clamp arms 174 first abuts first bending roller 176a of the pair of bending rollers 176, and is bent by first bending roller 176a. At this time, reaction force 212 of force 210 in which one of the pair of lead wires 98 is pressed by first bending roller 176a is applied to component main body 96. After lead wire 98 is bent by first bending roller 176a, lead wire 98 different from bent lead wire 98 abuts second bending roller 176b as illustrated in FIG. 17, and is bent by second bending roller 176b. At this time, reaction force 216 of force 214 in which lead wire 98 is pressed by second bending roller 176b is applied to component main body 96. In this manner, in tape feeder 82, since the pair of lead wires 98 is bent at different timings, reaction force 212 by first bending roller 176a and reaction force 216 by second bending roller 176b are not combined, and the reaction force on component main body 96 is suppressed. As a result, the damage of axial component 90 during bending of lead wires 98 can be suppressed.

In tape feeder 82, the pair of bending rollers 176 is arranged at positions deviated in the up-down direction, and the pair of lead wires 98 is bent at different timings by lifting axial component 90 by the operation of piston 150 such that the pair of lead wires 98 abuts on the pair of bending rollers 176. That is, the pair of lead wires 98 is bent at different timings by the operation of one driving source. As a result, the structure of bending device 112 of tape feeder 82 can be simplified, the cost thereof can be reduced, and the like.

Tape feeder 82 is an example of a component supply device. Axial component 90 is an example of a lead component. Lead wire 98 is an example of a lead. Bending device 112 is an example of a bending device. Piston 150 is an example of a driving source.

In addition, the present disclosure is not limited to the above embodiments, and can be implemented in various modes with various changes and improvements based on the knowledge of those skilled in the art. For example, although the present disclosure is applied to tape feeder 82 including feeding device 110, cutting device 111, and bending device 112 in the above embodiment, the present disclosure can be applied to a component supply device including at least bending device 112. That is, for example, a device including feeding device 110 and cutting device 111 may be detachably mounted on a component supply device having bending device 112, or, for example, a device including feeding device 110 may be detachably mounted on a component supply device having cutting device 111 and bending device 112. Moreover, bending device 112 may have at least a function of bending lead wire 98, and may not have a mechanism for clamping lead wire 98. That is, a device having a mechanism for clamping lead wire 98 may be detachably mounted on a component supply device having a function of bending lead wire 98. In this case, it is desirable that the mounting and dismounting is performed by one touch. The component supply device described herein may be detachably attached to the tape feeder holding stand of the component mounter by one touch, or may be fixedly attached to the component mounter.

In addition, the present disclosure is applied to tape feeder 82, that is, the device that supplies the lead component, but may be applied to other devices. Specifically, for example, the present disclosure may be applied to a device that bends lead wires 98 inserted into through holes formed in circuit substrate 12.

In addition, the present disclosure is applied to a device that bends lead wires 98 of axial component 90, but may be applied to a device that bends the lead wires of the radial component. Moreover, although the present disclosure is applied to a device that separates axial component 90 from taped component 88 and bends lead wires 98 of separated axial component 90, the present disclosure may be applied to a device that bends axial component 90 separated from taped component 88 in advance or bends axial component 90 not taped to carrier tape 92.

In the above embodiment, lead wires 98 are bent in a state in which lead wires 98 are clamped, but lead wires 98 may be bent in a state in which component main body 96 is clamped.

In the above embodiment, the pair of lead wires 98 is bent by one driving source, that is, the operation of piston 150, but one and the other of the pair of lead wires 98 may be bent by different driving sources. In the present embodiment, the pair of lead wires 98 is bent by the pair of bending rollers 176, but may be bent by one member.

REFERENCE SIGNS LIST

82: Tape feeder (component supply device), 90: axial component (lead component), 98: lead wire (lead), 112: bending device, 150: piston (driving source)

The invention claimed is:

1. A bending device configured to bend leads of a component one by one in a same direction at different timings, the bending device comprising:
    a support block below the component that is movable in a vertical direction;
    a pair of support members fixed to the support block, the pair of support members configured to contact and support the leads of the component from below;
    a pair of clamp arms swingably held to the support block, the pair of clamp arms configured to contact and clamp the leads of the component from above; and
    a pair of bending rollers arranged at different heights in the vertical direction above the leads of the component to bend the leads at the different timings.

2. The bending device according to claim 1, wherein the bending device bends the leads in a clamped state one by one in the same direction at the different timings.

3. The bending device according to claim 1, wherein the bending device bends the leads one by one in the same direction at the different timings by a movement of the support block in the vertical direction.

4. A component supply device comprising the bending device according to claim 1, comprising:
    a tape feeder that supplies the component supported by a tape to the bending device.

5. The bending device according to claim 1, wherein the support block is moved in the vertical direction to contact the leads to the pair of rollers.

* * * * *